United States Patent
Nagai

(10) Patent No.: US 7,350,446 B2
(45) Date of Patent: Apr. 1, 2008

(54) WAFER DIVIDING APPARATUS

(75) Inventor: Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 322 days.

(21) Appl. No.: 11/254,779

(22) Filed: Oct. 21, 2005

(65) Prior Publication Data

US 2006/0087008 A1 Apr. 27, 2006

(30) Foreign Application Priority Data

Oct. 26, 2004 (JP) .............................. 2004-311317

(51) Int. Cl.
- B26F 3/00 (2006.01)
- B26F 3/02 (2006.01)
- B65H 35/00 (2006.01)
- B65H 35/10 (2006.01)
- H01L 21/00 (2006.01)

(52) U.S. Cl. .................... 83/581; 225/103; 225/93; 225/97; 438/460; 438/462; 438/465; 438/463

(58) Field of Classification Search ............ 225/94–97, 225/103–105; 438/460–465
See application file for complete search history.

(56) References Cited

U.S. PATENT DOCUMENTS

| | | | | |
|---|---|---|---|---|
| 4,653,680 A | * | 3/1987 | Regan | ............ 225/104 |
| 5,310,104 A | * | 5/1994 | Zaidel et al. | .................. 225/2 |
| 6,685,073 B1 | * | 2/2004 | McKenna et al. | ............. 225/2 |
| 7,063,083 B2 | * | 6/2006 | Ohmiya et al. | ........... 125/23.01 |
| 7,179,721 B2 | * | 2/2007 | Nagai | ........................ 438/460 |
| 7,279,403 B2 | * | 10/2007 | Nagai et al. | ................ 438/462 |
| 2005/0090077 A1 | | 4/2005 | Nagai et al. | |
| 2005/0272225 A1 | * | 12/2005 | Weber et al. | ............... 438/460 |
| 2006/0073677 A1 | * | 4/2006 | Nakamura | .................. 438/460 |
| 2006/0081574 A1 | * | 4/2006 | Nagai | .................... 219/121.67 |
| 2006/0197260 A1 | * | 9/2006 | Yoshikawa et al. | ........ 264/482 |
| 2007/0045799 A1 | * | 3/2007 | Sekiya | ....................... 257/678 |

FOREIGN PATENT DOCUMENTS

| | | | |
|---|---|---|---|
| JP | 2002192370 | | 7/2002 |
| JP | 3408805 | | 3/2003 |
| JP | 2005-129607 | | 5/2005 |

\* cited by examiner

*Primary Examiner*—Ehud Gartenberg
*Assistant Examiner*—Bharat C Patel
(74) *Attorney, Agent, or Firm*—Smith, Gambrell & Russell, LLP

(57) ABSTRACT

A wafer dividing apparatus for dividing along dividing lines a wafer whose strength is reduced, along the dividing lines, comprising a tape holding means for holding a protective tape affixed to one surface side of the wafer; and a wafer dividing means comprising a first suction-holding member and a second suction-holding member, both having a holding surface for suction-holding the wafer held on the tape holding means through the protective tape on both sides of a dividing line through the protective tape, and a moving means for moving the first suction-holding member and the second suction-holding member in directions that they separate from each other, wherein the holding surface of the first suction-holding member and the holding surface of the second suction-holding member are inclined such that they descend or ascend toward their side edges that are opposed to each other.

5 Claims, 11 Drawing Sheets (a)

(b)

WAFER DIVIDING APPARATUS

FIELD OF THE INVENTION

The present invention relates to a wafer dividing apparatus for dividing a wafer having dividing lines formed in a lattice pattern on the front surface, along the dividing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas having each a circuit formed thereon. Further, an optical device wafer comprising gallium nitride-based compound semiconductors laminated on the front surface of a sapphire substrate is also cut along predetermined dividing lines to be divided into individual optical devices such as light emitting diodes or laser diodes, which are widely used in electric appliances.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the spindle and a drive mechanism for rotary-driving the rotary spindle. The cutting blade comprises a disk-like base and an annular cutting-edge which is mounted on the side wall peripheral portion of the base and formed as thick as about 20 μm by fixing diamond abrasive grains having a diameter of about 3 μm to the base by electroforming.

Since a sapphire substrate, silicon carbide substrate, etc. have high Mohs hardness, however, cutting with the above cutting blade is not always easy. Further, as the cutting blade has a thickness of about 20 μm, the dividing lines for sectioning devices must have a width of about 50 μm. Therefore, in the case of a device measuring 300 μm×300 μm, the area ratio of the streets to the device becomes 14%, thereby reducing productivity.

Meanwhile, as a means of dividing a plate-like workpiece such as a semiconductor wafer, a laser processing method for applying a pulse laser beam of a wavelength capable of passing through the workpiece with its focusing point set to the inside of the area to be divided is also attempted nowadays, and disclosed by Japanese Patent No. 3408805, for example. In the dividing method making use of this laser processing technique, the workpiece is divided by applying a pulse laser beam of an infrared range capable of passing through the workpiece from one surface side of the workpiece with its focusing point set to the inside to continuously form a deteriorated layer in the inside of the workpiece along the dividing lines and exerting external force along the dividing lines whose strength has been reduced by the formation of the deteriorated layers.

As a means of dividing a wafer having deteriorated layers formed continuously along dividing lines into individual chips by exerting external force along the dividing lines of the wafer, the applicant of this application has proposed in JP-A 2005-129607, a technology for dividing the wafer into individual chips by expanding a protective tape affixed to the wafer to give tensile force to the wafer.

However, in the method of giving tensile force to the wafer by expanding the protective tape affixed to the wafer, as when the protective tape affixed to the wafer is expanded, tensile force acts on the wafer radially and consequently, tensile force acts in a random direction on the dividing lines formed in a lattice pattern, whereby there occur problems that the wafer is divided irregularly and an undivided area remains. When a wafer having a test metal pattern called "test element group (TEG)" for testing the function of each circuit on the dividing lines is divided along the dividing lines by expanding the protective tape as described above, a problem may arise that irregular force acts on the above metal pattern, whereby the metal pattern is broken jaggedly, causes contamination and reduces the quality of each device.

To solve the above problems, the present applicant has proposed as Japanese Patent Application No. 2004-215111 a wafer dividing apparatus comprising a tape holding means for holding a protective tape affixed to one surface side of a wafer, a first suction-holding member and a second suction-holding member for suction-holding the wafer supported on the tape holding means through the protective tape on both sides of dividing lines through the protective tape, and a moving means for moving the first suction-holding members and the second suction-holding members in such directions that they are separated from each other.

However, there is a case where the wafer can not be divided along the dividing lines even with the wafer dividing apparatus proposed as Japanese Patent Application No. 2004-21511. Therefore, the above dividing apparatus is not always satisfactory.

SUMMARY OF THE INVENTION

It is an object of the present invention to provide a wafer dividing apparatus capable of dividing a wafer whose strength has been reduced along the dividing lines, along dividing lines precisely and surely.

To attain the above object, according to the present invention, there is provided a wafer dividing apparatus for dividing a wafer whose strength is reduced along the dividing lines, along dividing lines, comprising:

a tape holding means for holding a protective tape affixed to one surface side of the wafer; and a wafer dividing means comprising a first suction-holding member and a second suction-holding member, both having a holding surface for suction-holding the wafer held on the tape holding means through the protective tape on both sides of a dividing line through the protective tape, and a moving means for moving the first suction-holding member and the second suction-holding member in directions that they separate from each other, wherein the holding surface of the first suction-holding member and the holding surface of the second suction-holding member are inclined such that they descend or ascend toward their side edges that are opposed to each other.

Preferably, the wafer dividing apparatus further comprises indexing means for moving the wafer dividing means in the moving direction of the moving means. The second suction-holding members are movably mounted on the respective first suction-holding members, the moving means moves the second suction-holding member, and the indexing means moves the first suction-holding member. Preferably, the wafer dividing apparatus further has a detection means for detecting dividing lines of the wafer held on the tape holding means through the protective tape. The protective tape is mounted on an annular frame, and the tape holding means comprises a frame holding means for supporting the annular frame.

In the present invention, as the wafer dividing apparatus comprises first suction-holding members and second suction-holding members, both having a holding surface for suction-holding the wafer through the protective tape on both sides of a dividing line, and the holding surfaces of the first suction-holding members and the holding surfaces of the second suction-holding members are inclined such that they descend or ascend toward their side edges that are opposed to each other, bending stress is generated in the wafer to divide it along the dividing lines by suction-holding the wafer on the holding surfaces of the first suction-holding members and the holding surfaces of the second suction-holding members. Then, by moving the first suction-holding members and the second suction-holding members in directions that they separate from each other, the wafer is divided into individual chips along the dividing lines. Even when the test metal pattern called "test element group (TEG)" for testing the function of each circuit is arranged on the dividing lines of the wafer, this metal pattern is also broken along the dividing lines accurately.

DETAILED DESCRIPTION OF THE PREFERRED EMBODIMENT

A preferred embodiment of the wafer dividing apparatus of the present invention will be described in detail hereinunder with reference to the accompanying drawings.

Figure 1:
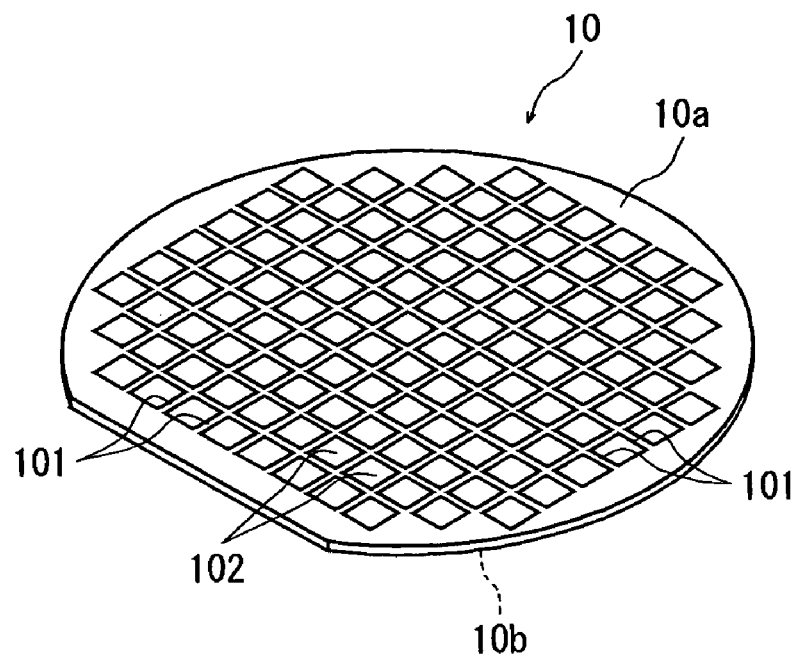
FIG. 1 is a perspective view of a semiconductor wafer to be divided by the wafer dividing apparatus constituted according to the present invention.

FIG. 1 is a perspective view of a semiconductor wafer as a wafer to be divided by the dividing apparatus constituted according to the present invention. The semiconductor wafer 10 shown in FIG. 1 is, for example, a silicon wafer having a thickness of 300 μm, and a plurality of dividing lines 101 are formed in a lattice pattern on the front surface 10a. A circuit 102 as a function element is formed in each of a plurality of areas sectioned by the plurality of dividing lines 101.

To divide the above semiconductor wafer 10 along the dividing lines, a deteriorated layer forming processing for forming a deteriorated layer in the inside of the semiconductor wafer 10 along the dividing lines 101 by applying a pulse laser beam of a wavelength capable of passing through the semiconductor wafer 10 along the dividing lines 101 is carried out to cause reduction of the strength of the semiconductor wafer 10 along the dividing lines 101. This deteriorated layer forming processing is carried out by using a laser beam processing machine 1 shown in FIGS. 2 to 4. The laser beam processing machine 1 shown in FIGS. 2 to 4 comprises a chuck table 11 for holding a workpiece, a laser beam application means 12 for applying a laser beam to the workpiece held on the chuck table 11, and an image pick-up means 13 for picking up an image of the workpiece held on the chuck table 11. The chuck table 11 is so constituted as to suction-hold the workpiece and is designed to be moved in a processing-feed direction indicated by an arrow X and an indexing-feed direction indicated by an arrow Y in FIG. 2 by a moving mechanism that is not shown.

Figure 3:
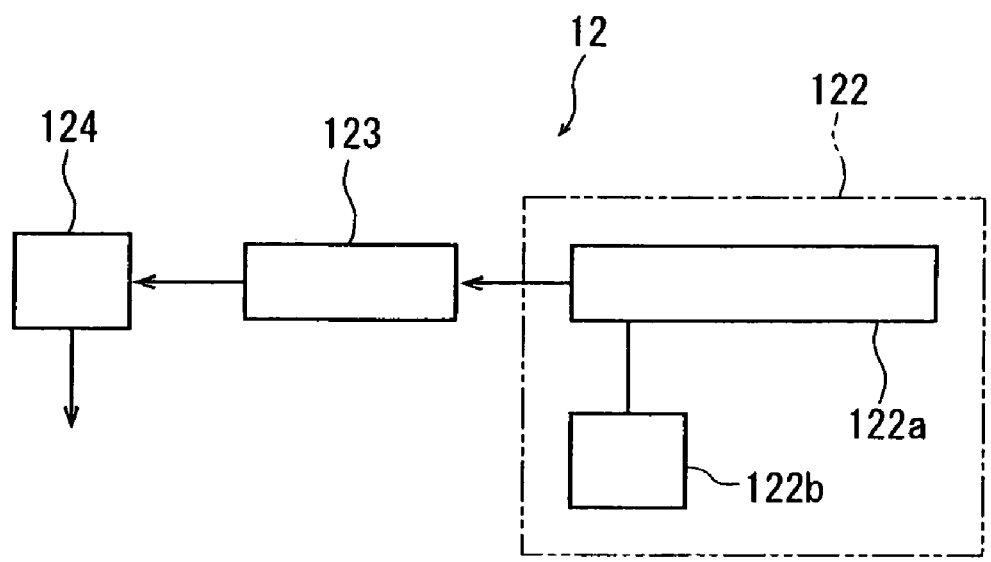
FIG. 3 is a block diagram schematically showing the constitution of a laser beam application means provided in the laser beam processing machine shown in FIG. 2.
Figure 4:
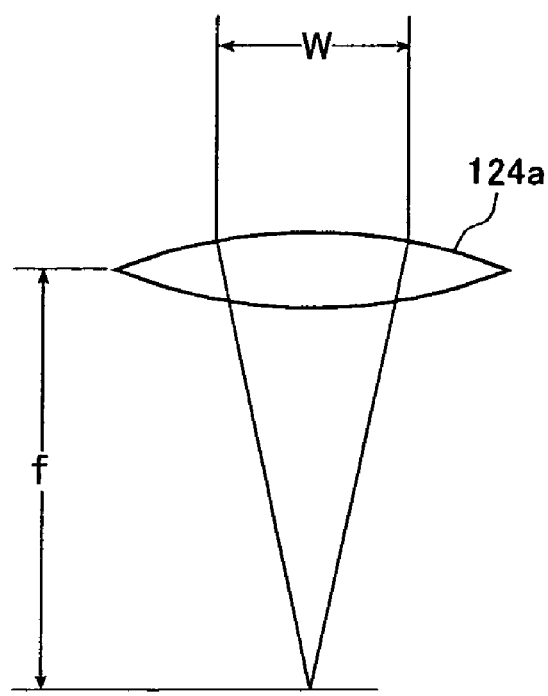
FIG. 4 is a schematic diagram showing the focusing spot diameter of a pulse laser beam.

The above laser beam application means 12 has a cylindrical casing 121 arranged substantially horizontally. In the casing 121, as shown in FIG. 3, there are installed a pulse laser beam oscillation means 122 and a transmission optical system 123. The pulse laser beam oscillation means 122 is constituted by a pulse laser beam oscillator 122a composed of a YAG laser oscillator or YVO4 laser oscillator and a repetition frequency setting means 122b connected to the pulse laser beam oscillator 122a. The transmission optical system 123 comprises suitable optical elements such as a beam splitter, etc. A condenser 124 housing condensing lenses (not shown) constituted by a set of lenses that may be formation known per se is attached to the end of the above casing 121. A laser beam oscillated from the above pulse laser beam oscillation means 122 reaches the condenser 124 through the transmission optical system 123 and is applied from the condenser 124 to the workpiece held on the above chuck table 11 at a predetermined focusing spot diameter D. This focusing spot diameter D is defined by the expression D (μm)=4×λ×f/(π×W) (wherein λ is the wavelength (μm) of the pulse laser beam, W is the diameter (mm) of the pulse laser beam applied to an objective lens 124a, and f is the focusing distance (mm) of the objective lens 124a) when the pulse laser beam showing a Gaussian distribution is applied through the objective lens 124a of the condenser 124, as shown in FIG. 4.

The image pick-up means 13 attached to the end of the casing 121 constituting the above laser beam application means 12 is constituting by an infrared illuminating means for applying infrared radiation to the workpiece, an optical system for capturing infrared radiation applied by the infrared illuminating means, and an image pick-up element (infrared CCD) for outputting an electric signal corresponding to infrared radiation captured by the optical system, in addition to an ordinary image pick-up element (CCD) for picking up an image with visible radiation in the illustrated embodiment. An image signal is transmitted to a control means, which will be described later.

The deteriorated layer forming processing which is carried out by using the above laser beam processing machine 1 will be described with reference to FIG. 2, FIGS. 5(a) and 5(b), and FIG. 6.

Figure 2:
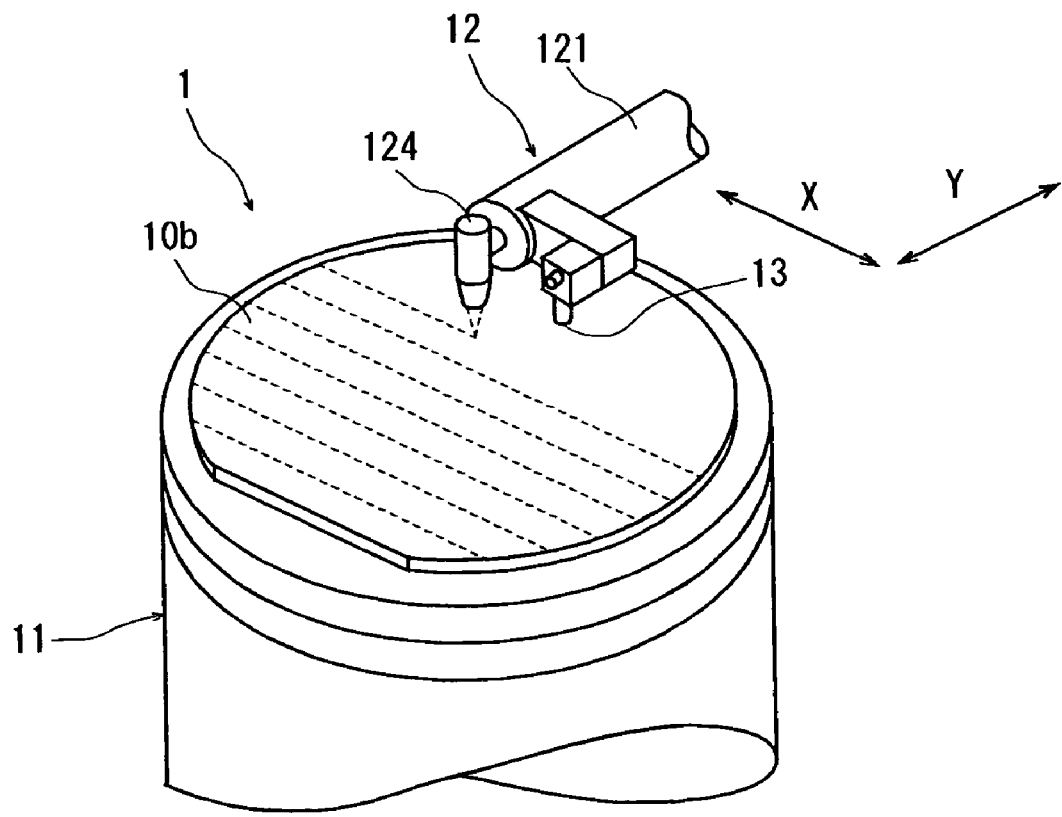
FIG. 2 is a perspective view of the principal section of a laser beam processing machine for forming a deteriorated layer in the semiconductor wafer shown in FIG. 1.

In this deteriorated layer forming processing, the semiconductor wafer 10 is first placed on the chuck table 11 of the laser beam processing machine 1 shown in FIG. 2 in such a manner that the back surface 10b faces up, and suction-held on the chuck table 11. The chuck table 11 suction-holding the semiconductor wafer 10 is brought to a position right below the image pick-up means 13 by a moving mechanism that is not shown.

After the chuck table 11 is positioned right below the image pick-up means 13, alignment work for detecting the area to be processed of the semiconductor wafer 10 is carried out by using the image pick-up means 13 and the control means that is not shown. That is, the image pick-up means 13 and the control means (not shown) carry out image processing such as pattern matching, etc. to align a dividing line 101 formed in a predetermined direction of the semiconductor wafer 10 with the condenser 124 of the laser beam application means 12 for applying a laser beam along the dividing line 101, thereby performing the alignment of a laser beam application position. The alignment of the laser beam application position is also carried out on dividing lines 101 formed on the semiconductor wafer 10 in a direction perpendicular to the predetermined direction. Although the front surface 10a having the dividing lines 101 formed thereon of the semiconductor wafer 10 faces down at this point, an image of the dividing line 101 can be picked up through the back surface 10b as the image pick-up means 13 is constituted by the infrared illuminating means, an optical system for capturing infrared radiation and an image pick-up element (infrared CCD) for outputting an electric signal corresponding to the infrared radiation, as described above.

Figure 5:
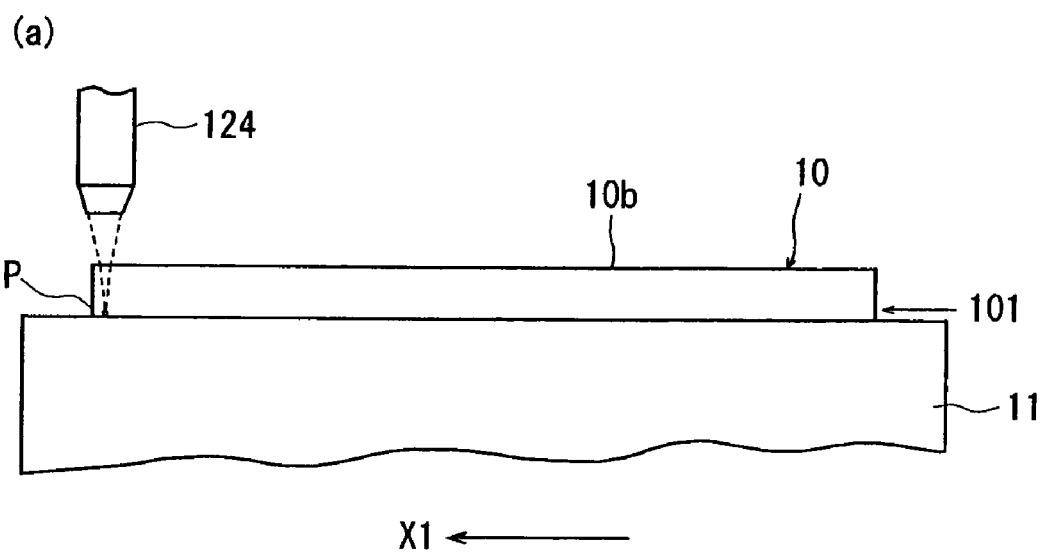
FIGS. 5(a) and 5(b) are explanatory diagrams showing a state where processing of forming a deteriorated layer is carried out along a dividing line of the semiconductor wafer by the laser beam processing machine shown in FIG. 2.

After the dividing line 101 formed on the semiconductor wafer 10 held on the chuck table 11 is detected and the alignment of the laser beam application position is carried out as described above, the chuck table 11 is moved to a laser beam application area where the condenser 124 of the laser beam application means 12 for applying a laser beam is located to bring one end (left end in FIG. 5(a)) of the predetermined dividing line 101 to a position right below the condenser 124 of the laser beam application means 12, as shown in FIG. 5(a). The chuck table 11, that is, the semiconductor wafer 10 is then moved in the direction indicated by the arrow X1 in FIG. 5(a) at a predetermined processing-feed rate while the pulse laser beam of a wavelength capable of passing through the semiconductor wafer 10 is applied from the condenser 124. When the application position of the condenser 124 of the laser beam application means 12 reaches the other end of the dividing line 101 as shown in FIG. 5(b), the application of the pulse laser beam is suspended and the movement of the chuck table 11, that is, the semiconductor wafer 10 is stopped. In this deteriorated layer forming processing, the focusing point P of the pulse laser beam is set to a position near the front surface 10a (undersurface) of the semiconductor wafer 10. As a result, a deteriorated layer 110 is exposed to the front surface 10a (undersurface) and is formed from the front surface 10a toward the inside. This deteriorated layer 110 is formed as a molten-resolidified layer (that is, as a layer that has been once molten and then re-solidified.) to be reduced in the strength.

The processing conditions in the above deteriorated layer forming processing are set as follows, for example.

Light source: LD excited Q switch Nd:YVO4 laser

Wavelength: pulse laser beam having a wavelength of 1,064 nm

Pulse output: 10 μJ

Focusing spot diameter: 1 μm

Repetition frequency: 100 kHz

Processing-feed rate: 100 mm/sec

Figure 6:
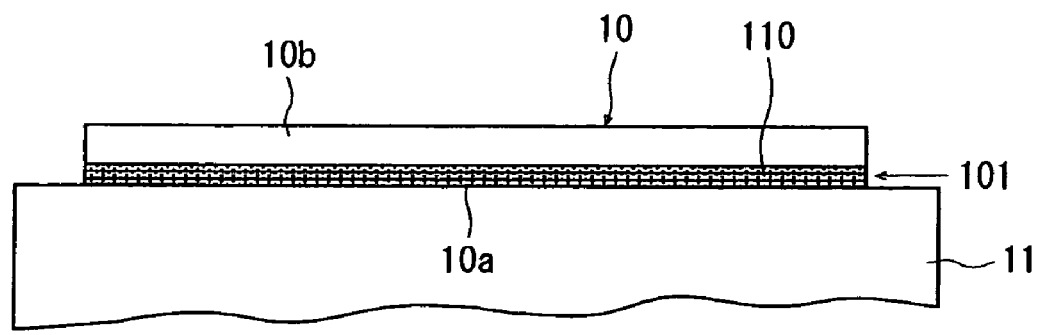
FIG. 6 is an explanatory diagram showing a state where deteriorated layers are laminated in the inside of the semiconductor wafer in the deteriorated layer forming processing shown in FIGS. 5(a) and 5(b)

When the semiconductor wafer 10 is thick, the above deteriorated layer forming processing is carried out a plurality of times by changing the focusing point P stepwise as shown in FIG. 6 to form a plurality of deteriorated layers 110. For example, since the thickness of the deteriorated layer formed each time under the above processing conditions is about 50 μm, the above deteriorated layer forming processing is carried out three times to form deteriorated layers 110 having a total thickness of 150 μM. In the case of a wafer 10 having a thickness of 300 μm, six deteriorated layers extending from the front surface 10a to the back surface 10b may be formed in the inside of the wafer 10 along the dividing line 101. Alternatively, the deteriorated layer 110 may be formed only in the inside of the semiconductor wafer 10 without exposing to the front surface 10a and the back surface 10b.

Figure 7:
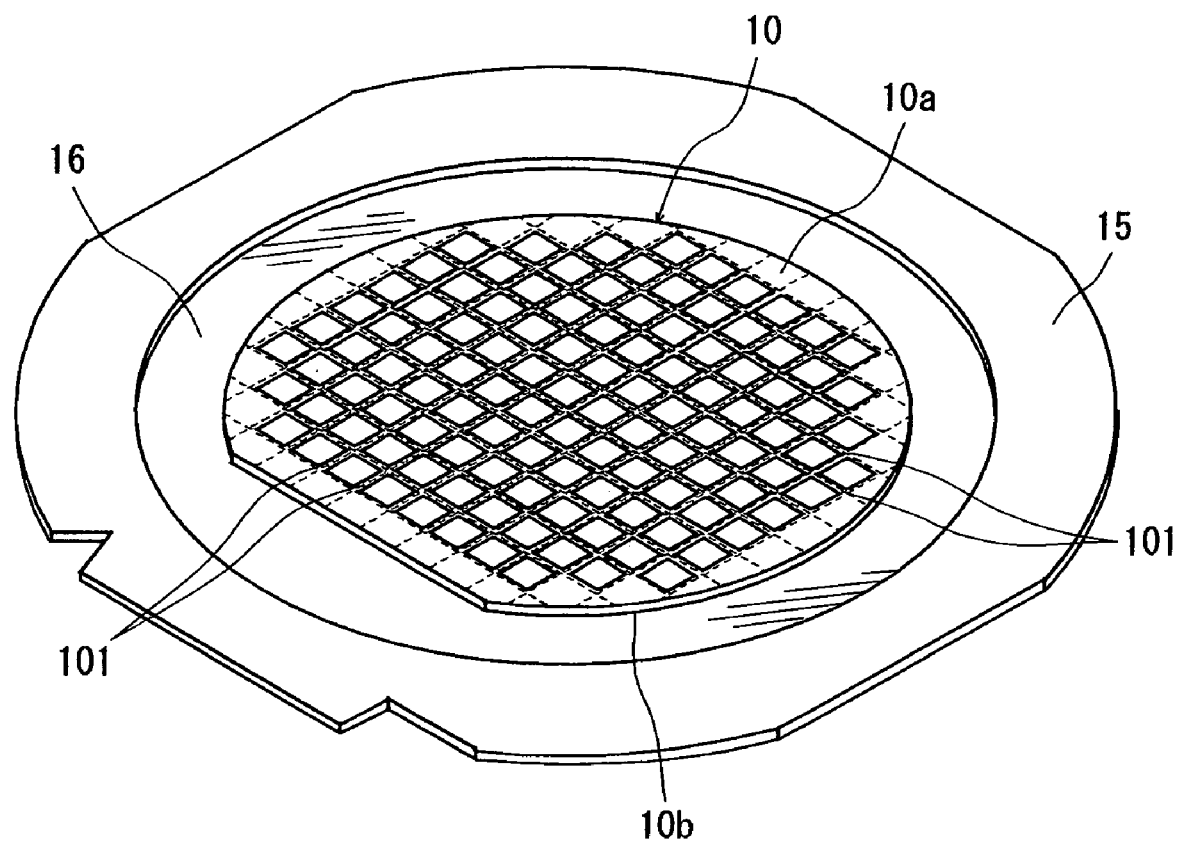
FIG. 7 is a perspective view showing a state where the semiconductor wafer which has undergone the deteriorated layer forming processing is put on the surface of a protective tape mounted on an annular frame.

After the deteriorated layer 110 is formed in the inside of the semiconductor wafer 10 along all the dividing lines 101 by the above-described deteriorated layer forming processing, the back surface 10b of the semiconductor wafer 10 is put on the surface of a protective tape 16 whose outer peripheral portion is so mounted on an annular frame 15 as to cover its inner opening, as shown in FIG. 7. In the illustrated embodiment, an about 5 μm-thick acrylic resin-based adhesive is coated on the surface of a 70 μm-thick sheet backing made of polyvinyl chloride (PVC), of the above protective tape 16. The semiconductor wafer 10 may be put on the protective tape 16 before the above deteriorated layer forming processing is carried out. That is, the front surface 10a of the semiconductor wafer 10 is put on the protective tape 16 in such a manner that the back surface 10b faces up, and the deteriorated layer forming processing is carried out in a state where the semiconductor wafer 10 is supported to the annular frame 15.

A description will be subsequently given of a dividing apparatus for dividing along the dividing lines 101 the semiconductor wafer 10 whose strength has been reduced by the formation of the deteriorated layers 110 along the dividing lines 101 with reference to FIG. 8 and FIG. 9.

Figure 8:
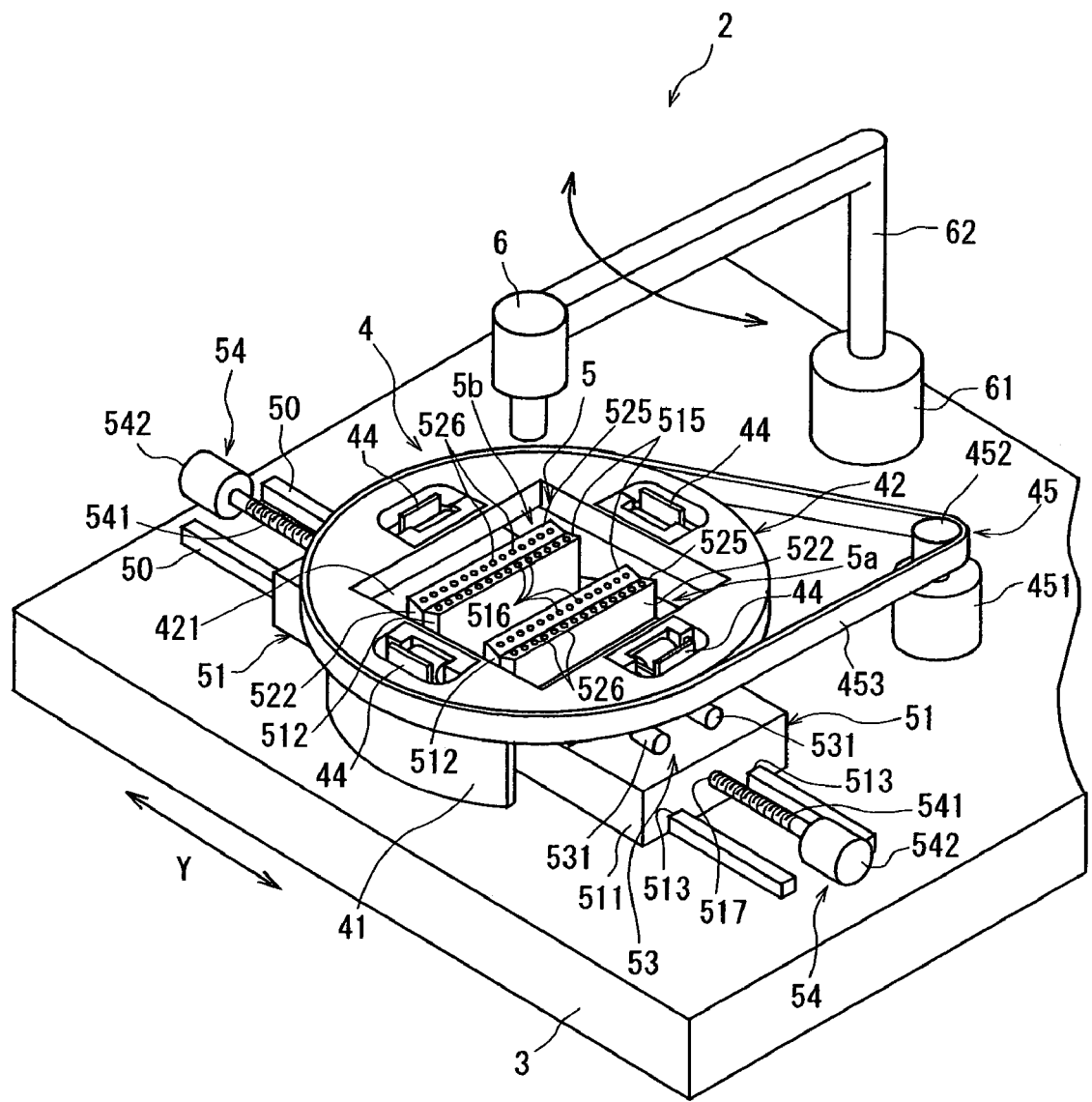
FIG. 8 is a perspective view of a wafer dividing apparatus constituted according to the present invention.
Figure 9:
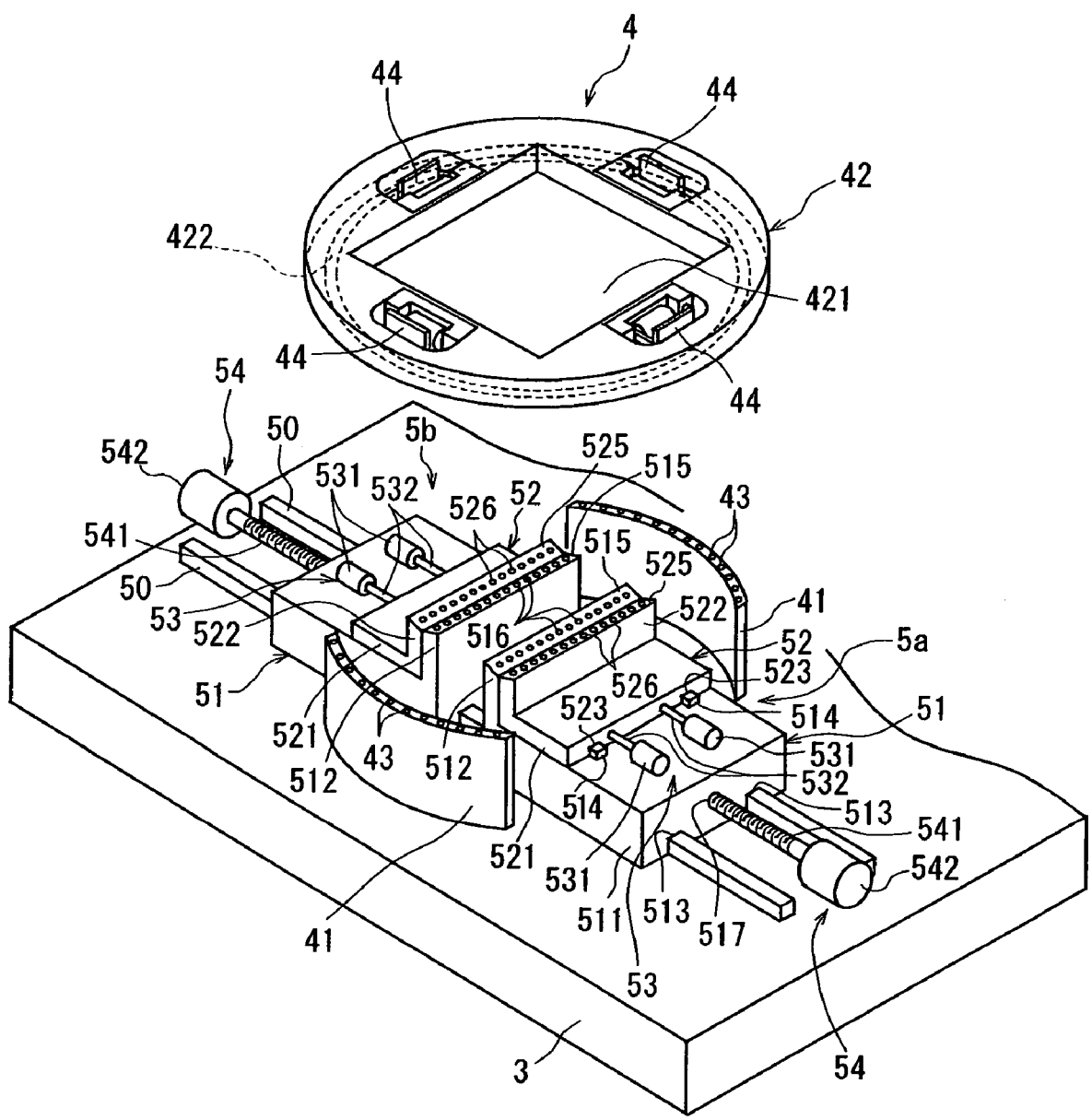
FIG. 9 is an exploded perspective view of the principal section of the wafer dividing apparatus shown in FIG. 8.

FIG. 8 is a perspective view of a wafer dividing apparatus constituted according to the present invention, and FIG. 9 is an exploded perspective view of the principal section of the dividing apparatus shown in FIG. 8. The wafer dividing apparatus 2 in the illustrated embodiment comprises a base 3, a frame holding means 4 that is mounted on the base 3 and holds the annular frame 15 shown in FIG. 7, and a first wafer dividing means 5a and a second wafer dividing means 5b for dividing the semiconductor wafer 10 supported on the annular frame 15 held on the frame holding means 4 through the protective tape 16 along the dividing lines 101.

The frame holding means 4 comprises a pair of support members 41 and 41 and a holding table 42 that is to be mounted on the pair of support members 41 and 41. The pair of support members 41 and 41 are arcuate with a predetermined curvature radius and are so arranged as to be opposed to each other with a predetermined space therebetween. The top surfaces of the pair of support members 41 and 41 have respectively a plurality of ball bearings 43. The holding table 42 is formed in a disk-like shape, and has a rectangular opening 421 at the center. On the upper surface of the holding table 42, four clamps 44 are arranged at positions where they are opposed to each other with the opening 421 therebetween. An annular to-be-guided groove 422 having the same radius as the curvature radius of the above pair of support members 41 and 41 is formed in the undersurface of the holding table 42. The thus constituted holding table 42 is supported by the ball bearings 43 when the annular to-be-guided groove 422 is fitted to the top end portions of the pair of support members 41 and 41. Therefore, the holding table 42 is supported such that it can turn along the curvatures of the pair of support members 41 and 41. The above annular frame 15 is supported by the thus constituted frame holding means 4. That is, the annular frame 15 supporting the semiconductor wafer 10 through the protective tape 16 as shown in FIG. 7 is placed on the holding table 42 and the annular frame 15 placed on the holding table 42 is fixed by the clamps 44. Therefore, the frame holding means 4 serves as a tape holding means for holding the protective tape 16 affixed to the above semiconductor wafer 10 through the annular frame 15.

The wafer dividing apparatus 2 in the illustrated embodiment comprises a turning means 45 for turning the above holding table 42 as shown in FIG. 8. This turning means 45 comprises a pulse motor 451 mounted on the above base 2, a pulley 452 connected to the rotary shaft of the pulse motor 451, and an endless belt 453 wound round the pulley 452 and an outer peripheral surface of the holding table 42. The thus constituted turning means 45 turns the holding table 42 via the pulley 452 and the endless belt 453 by driving the pulse motor 451.

A description will be subsequently given of the above first wafer dividing means 5a and the second wafer dividing means 5b.

The first wafer dividing means 5a and the second wafer dividing means 5b in the illustrated embodiment are arranged in series on a pair of guide rails 50 and 50 which are installed on the base 3 between the pair of support members 41 and 41 of the above frame holding means 4 and extend in parallel to each other in the direction indicated by the arrow Y. The first wafer dividing means 5a and the second wafer dividing means 5b are opposed to each other on the pair of guide rails 50 and 50 and is so constituted as to be moved along the pair of guide rails 50 and 50. The first wafer dividing means 5a and the second wafer dividing means 5b are substantially the same in constitution and therefore, the same members are given the same reference symbols.

The first wafer dividing means 5a and the second wafer dividing means 5b are each provided with a first suction-holding member 51 and a second suction-holding member 52. The first suction-holding member 51 is formed in an L-shape, and consists of a rectangular first support portion 511 and a first holding portion 512 extending upward from one end of the first support portion 511. A pair of to-be-guided grooves 513 and 513 corresponding to the pair of guide rails 50 and 50 are formed on the undersurface of the first support portion 511 constituting the first suction-holding member 51. By fitting the pair of to-be-guided grooves 513 and 513 to the pair of guide rails 50 and 50, the first suction-holding member 51 is supported movably along the pair of guide rails 50 and 50. A pair of guide rails 514 and 514 extending in the direction indicated by the arrow Y are mounted on the upper surface of the first support portion 511 constituting the first suction-holding member 51. The first holding portion 512 constituting the first suction-holding member 51 has an elongated rectangular first holding surface 515, which is arranged with in the opening 421 of the above holding table 42 and, at the upper end, extends in a direction perpendicular to the above Y direction. This first holding surface 515 has a length slightly larger than the diameter of the above semiconductor wafer and is positioned substantially at the same height as the upper surface of the above holding table 42. A plurality of suction holes 516 are formed in the first holding surface 515 of the first holding portion 512. The plurality of suction holes 516 are communicated to a suction means that is not shown. Therefore, when the suction means (not shown) is activated, negative pressure acts on the plurality of suction holes 516 to suction-hold the semiconductor wafer 10 on the first holding surface 515 through the above protective tape 16.

A description will be subsequently given of the second suction-holding member 52.

The second suction-holding member 52 is formed in an L-shape, and consists of a rectangular second support portion 521 and a second holding portion 522 extending upward from one end of the second support portion 521. A pair of to-be-guided grooves 523 and 523 corresponding to the pair of guide rails 514 and 514 provided on the first support portion 511 constituting the above first suction-holding member 51 are formed on the undersurface of the second support portion 521 constituting the second suction-holding member 52. By fitting the pair of to-be-guided grooves 523 and 523 to the pair of guide rails 514 and 514, the second suction-holding member 52 is supported movably along the pair of guide rails 514 and 514. The second holding portion 522 constituting the second suction-holding member 52 has an elongated rectangular second holding surface 525, which is arranged within the opening 421 of the above holding table 42 and, at the upper end, extends in a direction perpendicular to the above Y direction. This second holding surface 525 has the same length as the above first holding surface 515, that is, a length slightly larger than the diameter of the above semiconductor wafer and is positioned substantially at the same height as the upper surface of the above holding table 42. A plurality of suction holes 526 are formed in the second holding surface 525 of the second holding portion 522. The plurality of suction holes 526 are communicated with a suction means that is not shown. Therefore, when the suction means (not shown) is activated, negative pressure acts on the plurality of suction holes 526 to suction-hold the semiconductor wafer 10 on the second holding surface 525 through the above protective tape 16.

In the illustrated embodiment, the above first wafer dividing means 5a and the above second wafer dividing means 5b are arranged such that the first holding portions 512 of the first suction-holding members 51 are opposed to each other. Therefore, the second suction-holding members 52 and 52 mounted on the first suction-holding members 51 and 51 are designed to separate from the first suction-holding members 51 and 51 when they move respectively outward in opposite directions.

Figure 10:
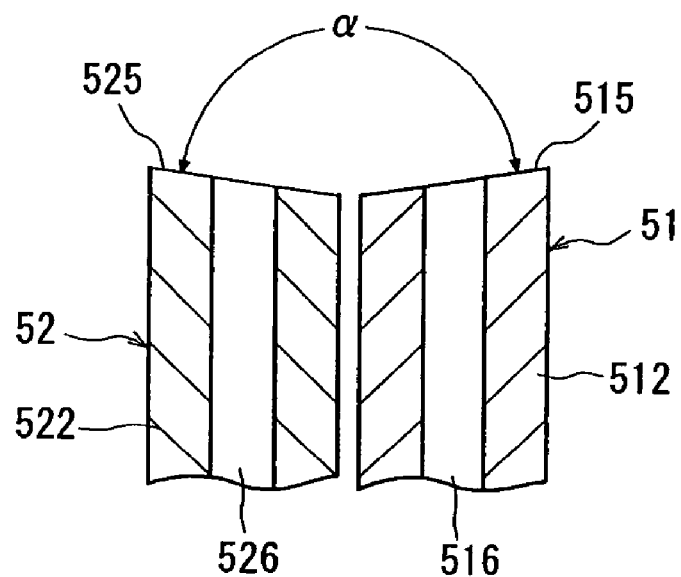
FIG. 10 is a sectional view of embodiments of a first suction-holding member and a second suction-holding member constituting the wafer dividing means provided in the wafer dividing apparatus shown in FIG. 8.

Here, the first holding surfaces 515 of the first suction-holding members 51 and the second holding surfaces 525 of the second suction-holding members 52 constituting the above first wafer dividing means 5a and the second wafer dividing means 5b will be described hereinunder. Since the first wafer dividing means 5a and the second wafer dividing means 5b are linearly symmetrical to each other, the first suction-holding member 51 and the second suction-holding member 52 constituting the first wafer dividing means 5a are shown in FIG. 10. Therefore, as for the first suction-holding member 51 and the second suction-holding member 52 constituting the second wafer dividing means 5b, the left position and the right position become reversed. The first holding surface 515 of the first suction-holding member 51 and the second holding surface 525 of the second suction-holding member 52 are inclined such that they descend toward their side edges that are opposed to each other, as shown in FIG. 10. The angle α formed by the first holding surface 515 and second holding surface 525 is suitably 170° to 178°.

Figure 11:
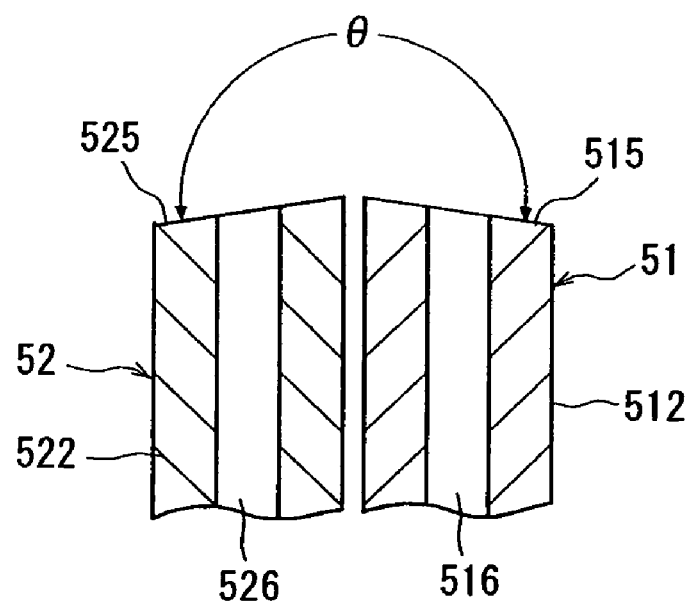
FIG. 11 is a sectional view of other embodiments of the first suction-holding member and the second suction-holding member constituting the wafer dividing means provided in the wafer dividing apparatus shown in FIG. 8.

Another embodiment of the first holding surfaces 515 of the first suction-holding members 51 and the second holding surfaces 525 of the second suction-holding members 52 constituting the first wafer dividing means 5a and the second wafer dividing means 5b will be described with reference to FIG. 11. Since the first wafer dividing means 5a and the second wafer dividing means 5b are linearly symmetrical to each other, the first suction-holding member 51 and the second suction-holding member 52 constituting the first wafer dividing means 5a are shown in FIG. 11. Therefore, as for the first suction-holding member 51 and the second suction-holding member 52 constituting the second wafer dividing means 5b, the left position and the right position become reversed. The first holding surface 515 of the first suction-holding member 51 and the second holding surface 525 of the second suction-holding member 52 are inclined such that they ascend toward their side edges that are opposed to each other. The angle θ formed by the first holding surface 515 and second holding surface 525 is suitably 182° to 190°.

Returning to FIG. 8 and FIG. 9, the first wafer dividing means 5a and the second wafer dividing means 5b in the illustrated embodiment comprise moving means 53 for moving the respective second suction-holding members 52 and 52 along the above pair of guide rails 514 and 514 in the direction indicated by the arrow y. Each of the moving means 53 consists of two air cylinders 531 and 531 mounted on the first support portion 511 of the first suction-holding member 51 as shown in FIG. 9, and their piston rods 532 and 532 are connected to the second support portion 521 of the second suction-holding member 52. The air cylinders 531 and 531 move the second suction-holding member 52 by about 0.5 to 2 mm in a direction that it separates from the first suction-holding member 51 by supplying compressed air to one of working chambers (not shown) and move the second suction-holding member 52 in a direction that it approaches the first suction-holding member 51 by supplying compressed air to the other working chamber that is not shown.

The first wafer dividing means 5a and the second wafer dividing means 5b in the illustrated embodiment have indexing means 54 for moving the respective first suction-holding members 51 along the pair of guide rails 50 and 50 in the direction indicated by the arrow Y. Each of the indexing means 54 comprises a male screw rod 541 arranged parallel to the pair of guide rails 50 and 50, a pulse motor 542 that is connected to one end of the male screw rod 541 and rotary-drives the male screw rod 541, and a bearing 543 (see FIG. 12) that is mounted on the base 3 and rotatably supports the other end of the male screw rod 541, as shown in FIG. 9. The male screw rod 541 is screwed into a threaded hole 517 formed in the first support portion 511 constituting the first suction-holding member 51. Therefore, by driving the pulse motor 542 in a normal direction or reverse direction, the first suction-holding member 51 can be moved along the pair of guide rails 50 and 50 in the direction indicated by the arrow Y.

Returning to FIG. 8, the wafer dividing apparatus 2 in the illustrated embodiment has a detection means 6 for detecting a dividing line 101 of the semiconductor wafer 10 supported to the annular frame 15 shown in FIG. 7 held on the holding table 42 constituting the above frame holding means 4 through the protective tape 16. The detection means 6 is attached to an L-shaped strut 62 connected to a turning mechanism 61 installed on the base 3. This detection means 6 is constituted by an optical system and an image pick-up element (CCD) and is located above the frame holding means 4. The thus constituted detection means 6 picks up an image of a dividing line 101 of the semiconductor wafer 10 supported to the annular frame 15 held on the above holding table 42 through the protective tape 16, converts the obtained image signal into an electric signal and sends the electric signal to the control means that is not shown. The L-shaped strut 62 supporting the detection means 6 is swung in the direction indicated by the arrow by the turning mechanism 61.

The wafer dividing apparatus 2 in the illustrated embodiment is constituted as described above, and its operation will be described hereinunder with reference mainly to FIG. 8 and FIGS. 12 to 14.

Figure 12:
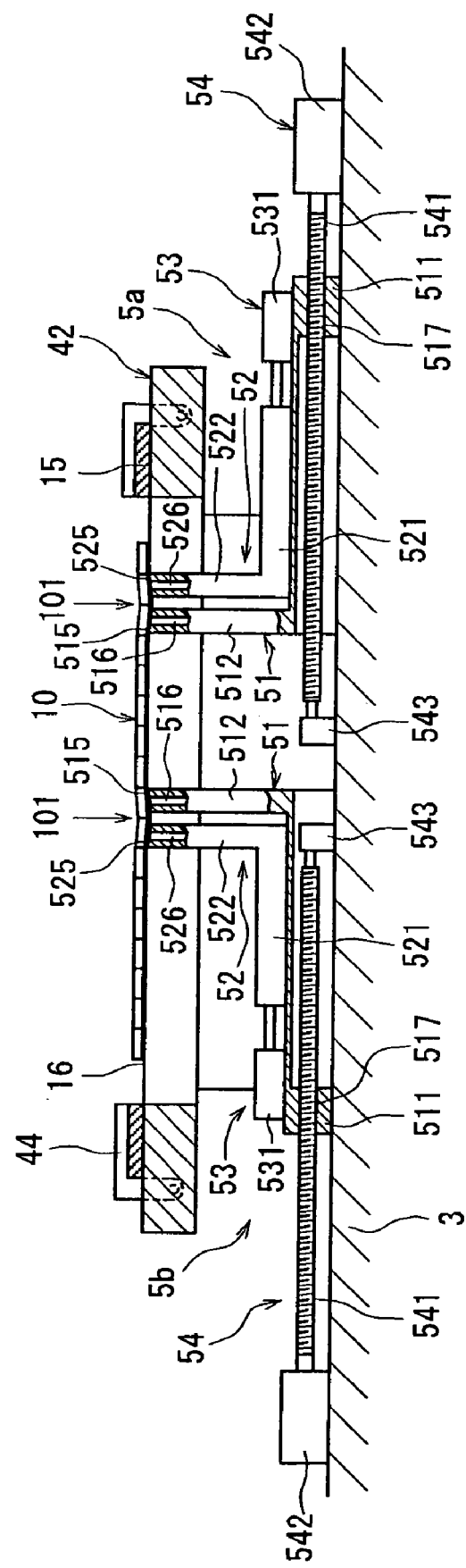
FIG. 12 is a sectional view of the principal section showing a state where a breaking force application step is carried out after holding the annular frame supporting the semiconductor wafer through the protective tape on frame holding means constituting the wafer dividing apparatus shown in FIG. 8.
Figure 13:
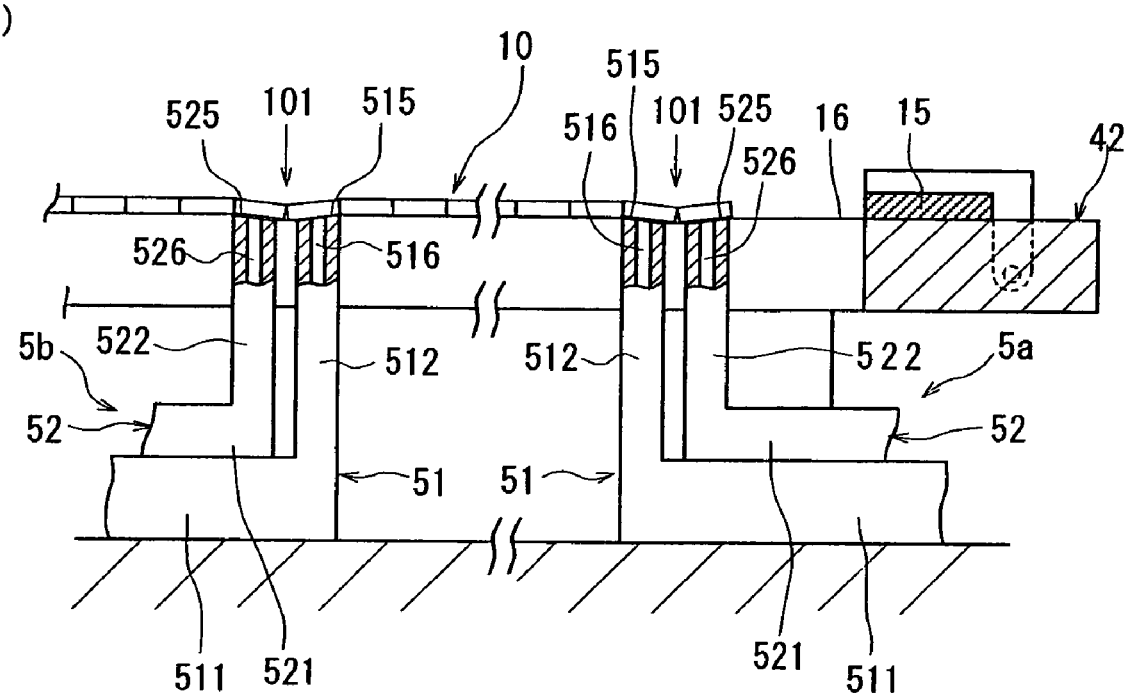
FIGS. 13(a) and 13(b) are explanatory diagrams showing a state where a tape expanding step is carried out after the breaking force application step with the dividing apparatus shown in FIG. 8.
Figure 13:
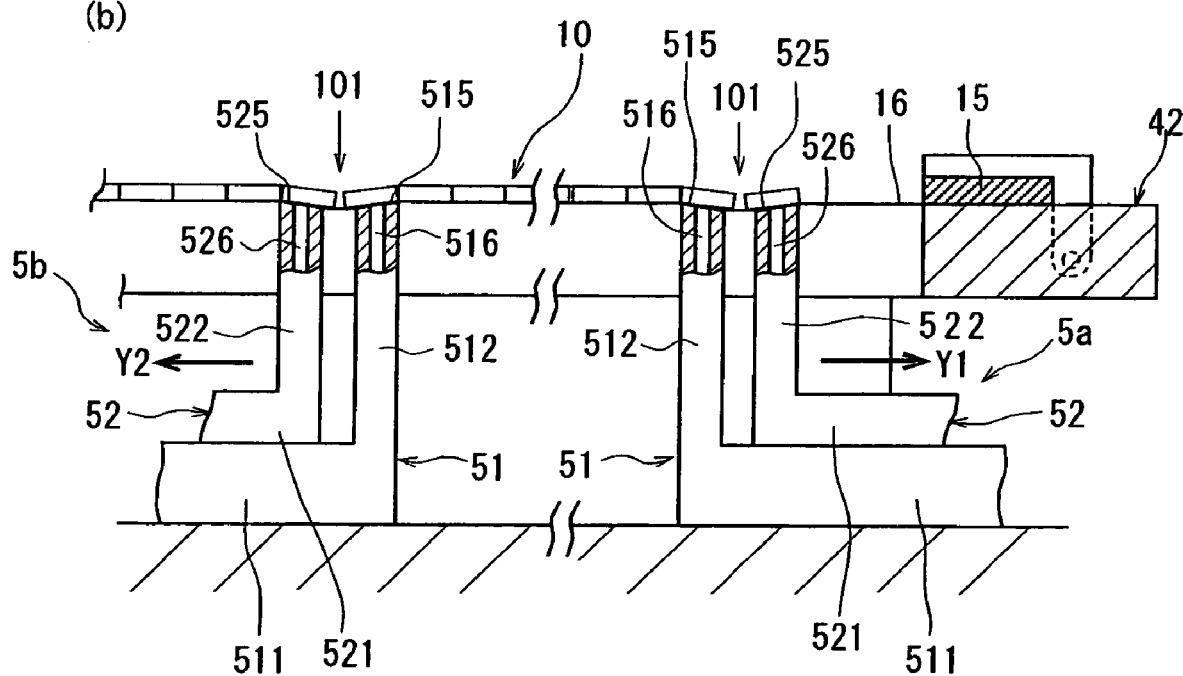

The annular frame 15 supporting the semiconductor wafer 10 whose strength has been reduced along the dividing lines 101, through the protective tape 16 as shown in FIG. 7 is placed on the upper surface of the holding table 42 constituting the frame holding means 4 and fixed on the holding table 42 by the clamps 44 as shown in FIG. 12.

After the annular frame 15 supporting the semiconductor wafer 10 through the protective tape 16 is held on the frame holding means 4, as shown in FIG. 12, the indexing means 54 of the first wafer dividing means 5a is activated to bring the first suction-holding member 51 and the second suction-holding member 52 of the first wafer dividing means 5a to a position corresponding to the most right dividing line 101 in FIG. 12 formed on the semiconductor wafer 10 in a predetermined direction, and the indexing means 54 of the second wafer dividing means 5b is activated to bring the first suction-holding member 51 and the second suction-holding member 52 of the second wafer dividing means 5b to a position corresponding to a central dividing line 101 in FIG.

12 formed on the semiconductor wafer 10 in the predetermined direction. Thereafter, the first holding surfaces 515 of the first holding portions 512 constituting the first suction-holding members 51 and the second holding surfaces 525 of the second holding portions 522 constituting the second suction-holding members 52 in the first wafer dividing means 5a and the second wafer dividing means 5b are positioned on both sides of the respective dividing lines 101. At this point, images of the dividing lines 101 are picked up by the detection means 6 and their positions each are aligned with the first holding surfaces 515 and the second holding surfaces 525.

Figure 14:
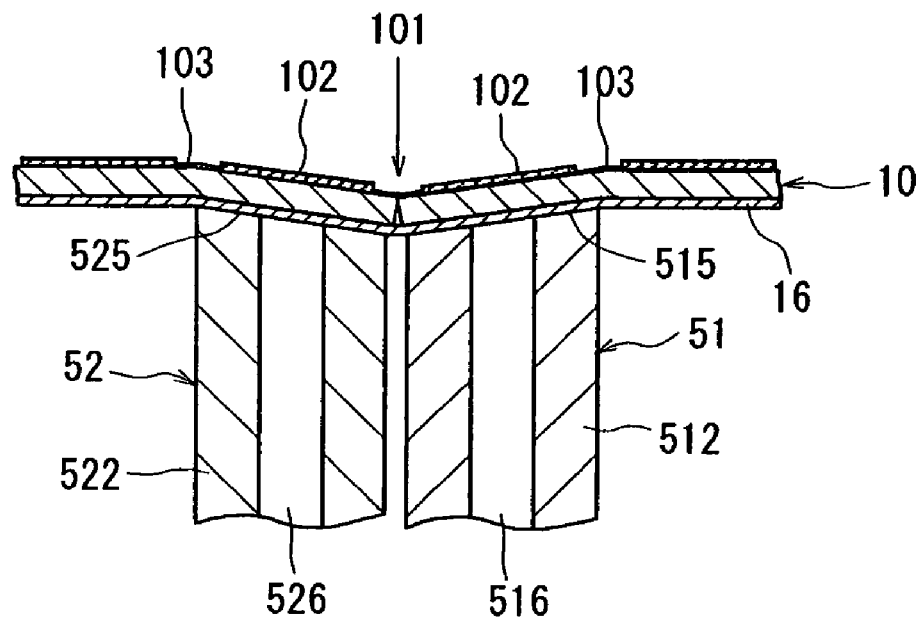
FIG. 14 is a sectional view of the principal section showing a state where an embodiment of the breaking force application step is carried out by the dividing apparatus shown in FIG. 8.

After the first suction-holding members 51 and the second suction-holding members 52 of the first wafer dividing means 5a and the second wafer dividing means 5b are respectively positioned at locations shown in FIG. 12, the suction means (not shown) communicated with the suction holes 516 and 526 formed in the first suction-holding members 51 and the second suction-holding members 52 are activated. As a result, negative pressure acts on the suction holes 516 and 526 as shown in FIG. 13(a) so that the semiconductor wafer 10 is suction-held on the first holding surfaces 515 of the first holding portions 512 and the second holding surfaces 525 of the second holding portions 522 through the protective tape 16. Since the first holding surface 515 of the first holding portion 512 and the second holding surface 525 of the second holding portion 522 shown in FIG. 10 are inclined such that they descend toward their side edges that are opposed to each other, the dividing line 101 positioned between the first holding surface 515 and the second holding surface 525 is sucked downward, thereby generating bending stress along the dividing line 101 to exert breaking force on the semiconductor wafer 10 along the dividing line 101 whose strength has been reduced, as shown in FIG. 14 (breaking force application step) At this point, the test metal pattern 103 called "test element group (TEG)" formed along the dividing lines 101 of the semiconductor wafer 10 remains unbroken as shown in FIG. 14.

Figure 15:
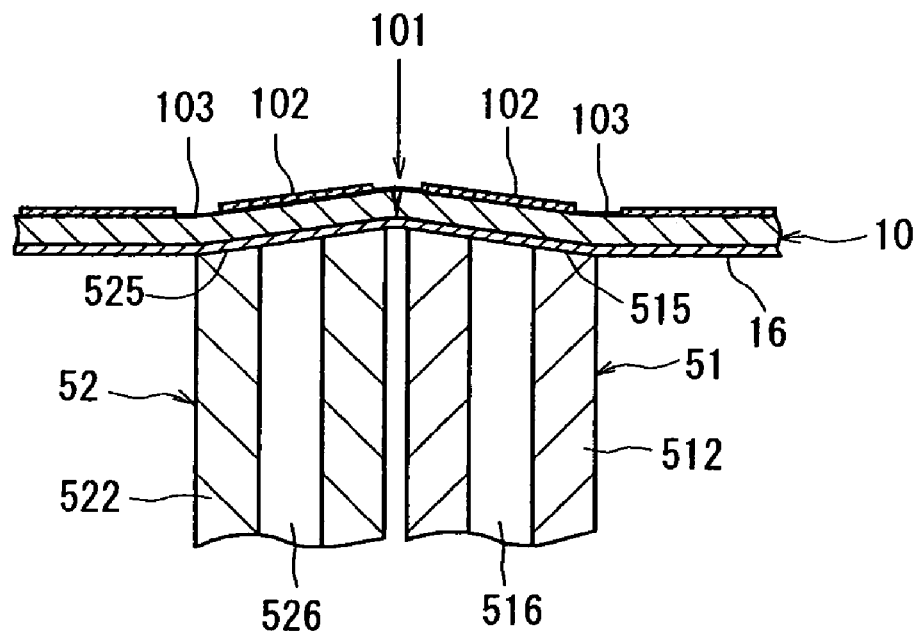
FIG. 15 is a sectional view of the principal section showing a state where another example of the breaking force application step is carried out by the dividing apparatus shown in FIG. 8.

When the first holding surface 515 of the first suction-holding member 51 and the second holding surface 525 of the second suction-holding member 52 shown in FIG. 11 are inclined such that they ascend toward their side edges that are opposed to each other, the dividing line 101 between the first holding surface 515 and the second holding surface 525 is pushed up by carrying out the aforementioned breaking force application step, thereby generating bending stress along the dividing line 101 to exert breaking force on the semiconductor wafer 10 along the dividing line 101 whose strength has been reduced, as shown in FIG. 15. In this case, too, the test metal pattern 103 called "test element group (TEG)" formed along the dividing lines 101 of the semiconductor wafer 10 may remain unbroken.

Figure 16:
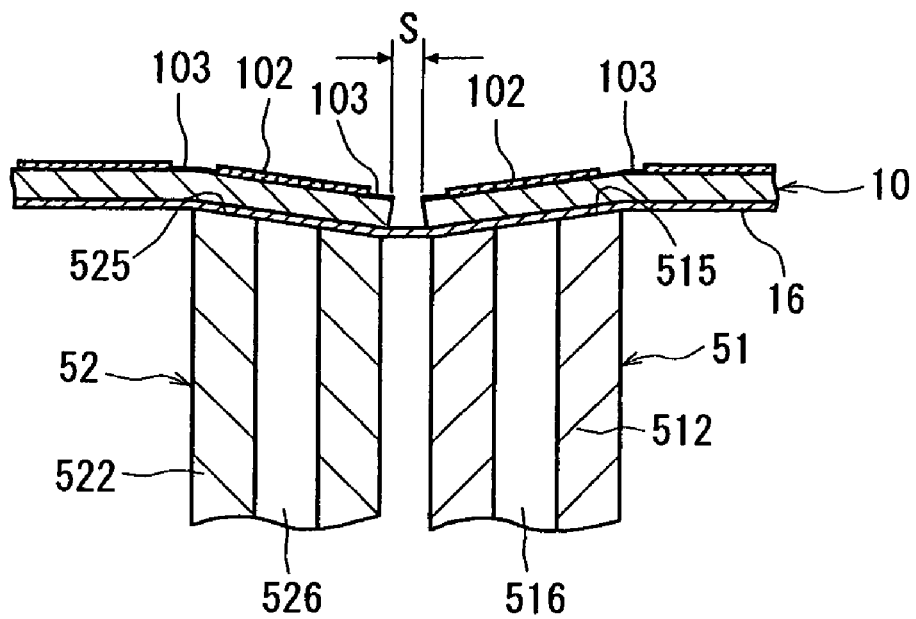
FIG. 16 is a sectional view of the principal section showing a state where an embodiment of the tape expanding step is carried out by the dividing apparatus shown in FIG. 8.
Figure 17:
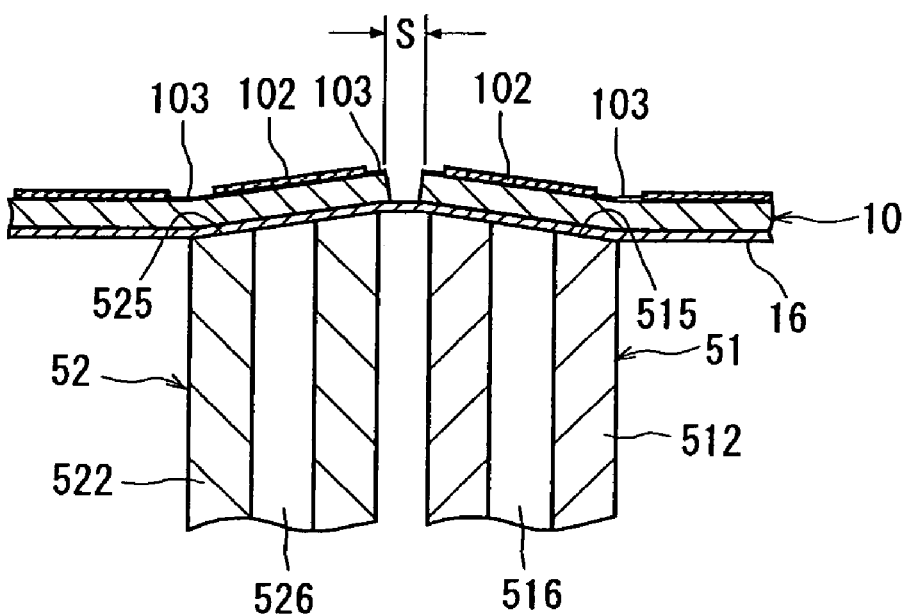
FIG. 17 is a sectional view of the principal section showing a state where another embodiment of the tape expanding step is carried out by the dividing apparatus shown in FIG. 8.

Thereafter, the air cylinders 531 constituting the moving means 53 of the first wafer dividing means 5a and the second wafer dividing means 5b are activated to move the second suction-holding member 52 of the first wafer dividing means 5a in the direction indicated by the arrow Y1 and to move the second suction-holding member 52 of the second wafer dividing means 5b in the direction indicated by the arrow Y2, respectively. That is, the second suction-holding members 52 of the first wafer dividing means 5a and the second wafer dividing means 5b are moved outward in directions that they separate from the first suction-holding members 51 (tape expanding step). As a result, as breaking force is applied to the semiconductor wafer 10 put on the protective tape 16 along the dividing lines 101 as described above, the semiconductor wafer 10 is easily divided along the dividing lines 101 as shown in FIG. 16 or FIG. 17, to form a space S. Therefore, tensile force is exerted on the test metal pattern 103 formed along the dividing lines 101 of the semiconductor wafer 10 to divide the metal pattern 103 along the dividing lines 103 accurately and surely. The distance of the second suction-holding members 52 to be moved outward from the first suction-holding members 51, that is, the above space S may be 0.5 to 1.0 mm.

Thus, in the illustrated embodiment, since the first holding surfaces 515 of the first suction-holding members 51 and the second holding surfaces 525 of the second suction-holding members 52 positioned on both sides of the dividing lines 101 are inclined such that they descend or ascend toward their side edges that is opposed to each other, bending stress is generated in the semiconductor wafer 10 along the dividing lines 101 between the first holding surfaces 515 and the second holding surfaces 525 by sucking the semiconductor wafer 10 via the protective tape 16. As a result, breaking force is exerted on the semiconductor wafer 10 along the dividing lines 101 whose strength has been reduced. Then, by moving the second suction-holding members 52 in directions that they separate from the first suction-holding members 51, tensile force is exerted on the test metal pattern 103 formed along the dividing lines 101 of the semiconductor wafer 10 to break the metal pattern along the dividing lines 101 accurately and surely because breaking force has been exerted on the semiconductor wafer 10 put on the protective tape 16 along the dividing lines 101 as described above. Further, as the first wafer dividing means 5a and the second wafer dividing means 5b are provided in the illustrated embodiment, the semiconductor wafer 10 can be divided along two dividing lines 101 at the same time, thereby improving productivity. Further, as the second suction-holding members 52 of the first wafer dividing means 5a and the second wafer dividing means 5b are constituted to be moved in outward direction so that they part from the first suction-holding members 51 in the above tape expanding step in the illustrated embodiment, compressive force does not act on the wafer of areas situated between the first suction-holding members 51 of the first wafer dividing means 5a and the second wafer dividing means 5b and consequently, the wafer is not damaged.

After the breaking force application step and the tape expanding step are carried out along the dividing lines 101 formed in the predetermined direction as described above, the suction-holding of the semiconductor wafer 10 by the first suction-holding members 51 and the second suction-holding members 52 of the first wafer dividing means 5a and the second wafer dividing means 5b is canceled. Thereafter, the indexing means 54 of the first wafer dividing means 5a and the indexing means 54 of the second wafer dividing means 5b are activated to move the first suction-holding members 51 and the second suction-holding members 52 by a distance corresponding to the interval between the dividing lines 101 leftwards in FIG. 12 respectively to bring them to positions corresponding to dividing lines 101 adjacent to and on the left in FIG. 12 of the dividing lines 101, which have undergone the above breaking force application step and tape expanding step. Then, the above breaking force application step and tape expanding step are carried out.

After the above breaking force application step and the tape expanding step are carried out on all the dividing lines 101 formed in the predetermined direction, the turning means 45 is activated to turn the holding table 42 of the frame holding means 4 at 90°. As a result, the semiconductor wafer 10 held on the holding table 42 of the frame holding means 4 is also turned at 90°, so that dividing lines 101 formed in a direction perpendicular to the dividing lines 101 which have been formed in the predetermined direction and have undergone the above breaking force application step and the tape expanding step are positioned in parallel to the first holding surfaces 515 of the first suction-holding members 51 and the second holding surfaces 525 of the second suction-holding members 52 of the first wafer dividing means 5a and the second wafer dividing means 5b. Then, the above-described breaking force application step and tape expanding step are carried out on all the dividing lines 101 formed in the direction perpendicular to the dividing lines 101 which have undergone the above breaking force application and the tape expanding step, whereby the semiconductor wafer 10 is divided into individual semiconductor chips along the dividing lines 101.

While the present invention has been described above by way of a preferred embodiment with reference to the accompanying drawings, it should be noted that the present invention is in no way limited to the above embodiment only but can be changed or modified in other various ways without departing from the scope of the present invention. For example, two wafer dividing means (first wafer diving means 5a and second wafer dividing means 5b) are provided in the illustrated embodiment. However, only one wafer dividing means may be provided.

What is claimed is:

1. A wafer dividing apparatus for dividing a wafer whose strength is reduced along dividing lines, along the dividing lines, comprising:
   a tape holding means for holding a protective tape affixed to one surface side of the wafer; and
   a wafer dividing means comprising a first suction-holding member and a second suction-holding member, both having a holding surface for suction-holding the wafer held on the tape holding means through the protective tape on both sides of a dividing line through the protective tape, and a moving means for moving the first suction-holding member and the second suction-holding member in directions that they separate from each other, wherein
   the holding surface of the first suction-holding member and the holding surface of the second suction-holding member are inclined such that they descend or ascend toward their opposed side edges.

2. The wafer dividing apparatus according to claim 1 which further comprises indexing means for moving the wafer dividing means in the moving direction of the moving means.

3. The wafer dividing apparatus according to claim 2, wherein the second suction-holding members are movably mounted on the respective first suction-holding member, the moving means move the second suction-holding member, and the indexing means move the first suction-holding member.

4. The wafer dividing apparatus according to claim 1 which further has a detection means for detecting dividing lines of the wafer held on the tape holding means through the protective tape.

5. The wafer dividing apparatus according to claim 1, wherein the protective tape is mounted on an annular frame, and the tape holding means comprises a frame holding means for supporting the annular frame.

* * * * *